United States Patent [19]

Schofield

[11] Patent Number: 4,504,759
[45] Date of Patent: Mar. 12, 1985

[54] SAW DEVICE WITH SPECIAL LENGTH-WEIGHTED INTERDIGITAL ELECTRODE ARRAY

[75] Inventor: John Schofield, Coulsdon, England
[73] Assignee: U.S. Philips Corporation, New York, N.Y.
[21] Appl. No.: 558,407
[22] Filed: Dec. 5, 1983
[30] Foreign Application Priority Data Dec. 22, 1982 [GB] United Kingdom ............... 8236366

[51] Int. Cl.³ .............................................. H03H 9/25
[52] U.S. Cl. ............... 310/313 C; 310/313 B–313 D; 333/151; 333/154; 333/195
[58] Field of Search ...................... 310/313 B–313 D; 333/151, 154, 193, 194, 195, 196

[56] References Cited

U.S. PATENT DOCUMENTS

| 4,083,021 | 4/1978 | Autran et al. | 333/194 |
| 4,160,219 | 7/1979 | Kuny | 310/313 C |
| 4,342,011 | 7/1982 | Iwamoto et al. | 333/151 |
| 4,375,624 | 3/1983 | DeVries | 333/195 |
| 4,420,728 | 12/1983 | Bower | 333/196 |

FOREIGN PATENT DOCUMENTS 2854072 7/1979 Fed. Rep. of Germany .
56-46318 4/1981 Japan ................................. 333/151
1381912 1/1975 United Kingdom ............... 333/195

OTHER PUBLICATIONS

Ronnekleiv et al., "Design Problems in Surface Wave Filters", IEEE Int'l. Specialist Seminar on Component Performance and Systems Applications of SAW Devices, 1973, pp. 141–151.

Primary Examiner—William H. Beha, Jr.
Assistant Examiner—D. L. Rebsch
Attorney, Agent, or Firm—Robert T. Mayer; Bernard Franzblau

[57] ABSTRACT

A surface acoustic wave device includes apodized interdigital electrode arrays 2,3 coupled by a multistrip coupler 5. In a device in which the apodization 8 comprises a main lobe flanked by a succession of minor lobes, the effects of diffraction relating to short electrode pair overlaps are reduced by dividing at least the far end of the array into two or more series connected array portions 21, 22. Difficulties arising from unbalanced electrode edge overlaps at transitions 20 between different members of electrode pairs connected in series are reduced by locating such transitions in the region of nulls in the apodization pattern.

6 Claims, 5 Drawing Figures

SAW DEVICE WITH SPECIAL LENGTH-WEIGHTED INTERDIGITAL ELECTRODE ARRAY

The invention relates to a surface acoustic wave device, including a piezoelectric substrate for propagating a surface acoustic wave on one of its surfaces, and transducer means for launching or receiving surface acoustic wave energy propagating along a predetermined propagation direction on that surface. The transducer means comprises a length weighted interdigital electrode array providing, along a propagation path, the effect of a sequence of weighted taps, the weighting factors of which conform to an envelope of values having a main lobe and at least a respective minor lobe before and after the main lobe. Each tap is formed principally by the overlapping portion of a pair of overlapping adjacent electrodes between which a signal frequency potential difference is to be applied or detected, or by the overlapping portions of a plurality of similar said pairs of electrodes arranged in a series electrical connection so as to transduce the same phase of a surface acoustic wavefront propagating along said propagation direction, and in which some taps associated with smaller weighting factors are formed by a greater number of said pairs of electrodes in series connection than a tap associated with a larger weighting factor. Such a device will be referred to herein as a surface acoustic wave device of the kind specified.

A device of the kind specified is described in a paper by Ronnekleiv A., et al. 'Design problems in surface wave filters', IEEE International Specialist Seminar on Component Performance and Systems Applications of Surface Acoustic Wave Devices, 1973, pages 141 to 151.

As is well known, a surface acoustic wave filter using apodized interdigital electrode arrays is a form of transversal filter in which the effect of weighted taps is provided, principally, by the overlaps of corresponding pairs of adjacent electrodes in the form of conducting strips fed with a signal of opposite polarity, e.g. by connection to opposite bus-bars. The associated weighting factor will be dependent inter alia on the amount of electrode overlap.

The distribution of electrode overlaps along an apodized transducer can be indicated diagrammatically by an overlap envelope, namely a pair of lines drawn to follow the respective ends of the overlap between adjacent electrodes along the interdigital array. The outer limits of the overlap envelope represent the boundaries of the acoustic aperture of the transducer.

An ideal transversal filter can be computed in terms of the weighting factors and periodicity of the taps to satisfy a desired response characteristic to within given approximations by Fourier synthesis and computer optimization. Corresponding corrections and allowances can be applied in the process to provide a result in terms of distribution and overlap lengths of pairs of adjacent electrodes to form corresponding idealized apodized interdigital electrode arrays. The electrode overlap envelope can therefore also be regarded as representative of an envelope of the weighting factor values allocated to the corresponding taps of the transversal filter.

In the case of, for example, a fairly wide, flat topped, steep sided filter pass-band with low phase ripple, a frequent requirement in color television equipment, Fourier transform considerations would suggest that the envelope of weighting factor values would take the form of a main lobe preceeded and followed along a transducer array by a sequence of minor lobes, extending in some cases for a considerable distance.

It will be apparent that a tap having a small weighting factor would be formed by a corresponding short electrode overlap. Thus, even in the case of a transducer whose aperture is several wavelengths, many of the taps making up the minor lobes will be formed by electrode overlaps of the order of a wavelength or less. This means, from considerations of diffraction theory, that a surface acoustic wave-front associated with such a short transducing overlap will tend not to behave in the ideal manner assumed during computation, as the distance travelled along the transducer is increased.

The paper by Rønnekleiv et al. proposes a design technique for reducing adverse effects which can result from taps provided by a short electrode overlap. In the paper, some or all of the taps in a transducing array are formed by a series electrical connection across the transducer array from one signal bus bar to the other, of pairs of overlapping electrodes having similar overlaps, arranged so as to transduce the same phase of a linear surface acoustic wavefront propagating along the axis of the array. In order to provide a tap having the same weighting factor as that formed by a single pair of electrodes, the length of overlap of each electrode pair in the series connection should be substantially the same as that of the equivalent single electrode pair. In this way a number of in-phase transducing elements (i.e. overlapping pairs of oppositely poled electrodes) are distributed across the array aperture, which are capable of transducing a more parallel beam component, having less energy spread due to diffraction.

The paper discloses a surface acoustic wave device of the kind specified in which the taps are spaced at distances of $3\lambda c/2$ and $5\lambda c/2$ in the respective transducers, where $\lambda c$ is the center wavelength of the pass-band. However, when an attempt is made to construct a filter with a greater tap density using a normal electrode spacing of $\lambda/2$ and hence a corresponding tap spacing, difficulties arise which make the measured response tend to depart unacceptably from the design criteria used as a basis for the computed electrode structure of the device.

It is an object of the invention to provide an improved surface acoustic wave device of the kind specified.

According to the invention, there is provided an acoustic surface wave device of the kind specified, characterized in that the transducer array is made up of a succession of nonoverlapping groups of taps, each group consisting of taps formed by the same respective number of such series connected pairs of electrodes, and the transition from each group to a next adjacent group, whose taps are formed by a different number n of pairs of electrodes which are series connected when $n>1$ is arranged substantially to coincide with a corresponding null in the envelope of weighting factor values.

The invention is based on the realization that in building up a closely spaced array of interdigital electrodes in which at least some adjacent taps are provided by respective series connections formed by different numbers of pairs of overlapping electrodes, undesired surface acoustic wave transducing effects will be set up between the different number of edges of the respective series-connected electrodes at different signal potentials, which are adjacent on either side of a transition, resulting, in general, in the effect of an undesired tap or of an undesired weighting factor value for a desired tap at that location, which can significantly disturb the response characteristics of the device, and that this difficulty can be reduced or overcome in a device of the kind specified by locating each transition between the series connections of different numbers of electrode pairs substantially in the region of a corresponding null in the envelope of weighting factor values, thus enabling the magnitudes of the positive and negative components of the undesired transducing effects between adjacent electrode edges on either side of a given transition to be balanced in a relatively simple manner.

Embodiments of the invention will now be described by way of example, with reference to the accompanying diagrammatic drawings, in which.

Figure 1:
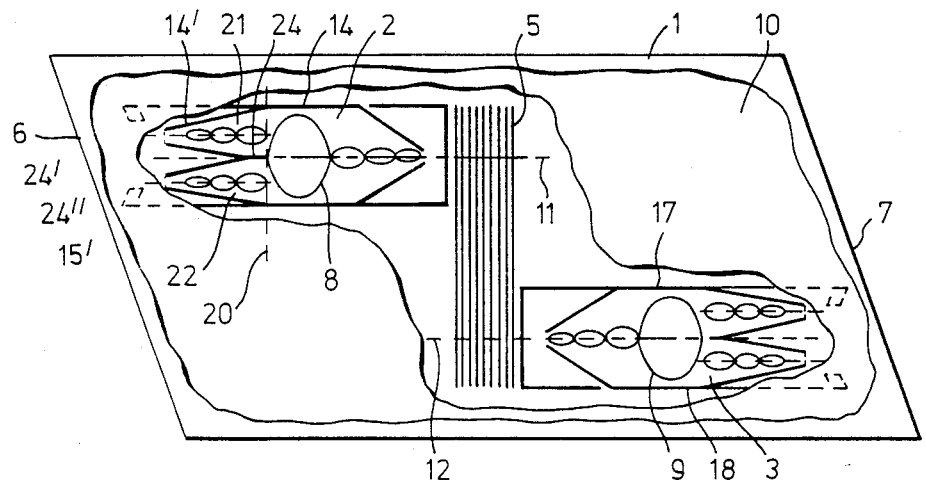
FIG. 1 shows a surface acoustic wave device in accordance with the invention.

FIG. 1 shows a surface acoustic wave device in accordance with the invention, comprising a piezoelectric body 1, for example a rotated Y-cut X-propagating lithium niobate crystal wafer on a surface of which are located apodized interdigital transducer arrays 2,3, for launching and receiving surface acoustic waves, and a multistrip coupler 5 for extracting surface acoustic wave energy launched by one transducer, e.g. transducer 2 along a track containing the central axis 11 of that transducer, and relaunching at least some of the energy as a surface acoustic wave along a further track containing the central axis 12 of the other transducer 3 in the direction of that transducer. By this means, adverse effects on the device response resulting from bulk waves travelling at velocities near to that of the surface waves can be significantly reduced.

The transducers 2,3 and the multistrip coupler are formed suitably by photolithography from vapor-deposited layer of metal. Each transducer 2,3 comprises a length-weighted interdigital electrode array in which the electrodes have a center to center spacing of $\lambda c/2$, where $\lambda c$ is the center wavelength of the pass-band of the device, and each electrode takes the form of a double electrode, i.e. the two parallel electrode strips $\lambda c/8$ wide spaced center to center by $\lambda c/4$. Alternate electrodes are, in general, connected to respective opposite bus bars 14 and 15 or 17 and 18, across which a signal feed is applied or from which a transduced electrical signal is derived. Along each array, pairs of adjacent electrodes overlap, each pair forming a tap on the surface acoustic wave delay path along the array with an associated weighting factor which will be dependent on the amount and sense of the electrode overlap.

The overlap envelopes 8 and 9 of the interdigital electrode arrays 2 and 3 are indicated in FIG. 1, and substantially correspond to the envelope of weighting factor values associated with the equivalent sequence of weighted taps of a corresponding transversal filter component whose effect is to be simulated by the respective length-weighted interdigital electrode array 2,3. It will be apparent that the respective overlap envelopes 8,9 and thus the corresponding envelopes of weighting factor values, comprise a central main lobe, together with a plurality of minor lobes distributed along the surface wave propagation path through the respective array before and after the central main lobe.

The arrays 2,3 are each made up of two regions, each region containing a corresponding group of taps. In the array 2, for example, a first region to the right of the line 20 in FIG. 1 contains a group of taps, each formed by the overlap of a corresponding single pair of adjacent electrodes fed with a signal frequency potential difference from the terminal bus bars 14, 15. A second region to the left of the line 20 in the array 2, and in which several of the minor lobes are to be found, contains a further group of taps, each formed by the overlapping portions of two similar pairs of adjacent electrodes arranged in a series electrical connection from one terminal bus bar 14 to the other 15, and disposed so as to transduce the same phase of a linear surface acoustic wavefront propagating along the central axis 11 of the array 2. In this embodiment, the series connected portions 21, 22 of the array 2 have a common intermediate series-connection formed by a central bus bar 24. In FIG. 1 the array 3 similarly comprises a first region containing the main lobe in which the taps are each formed by a single pair of overlapping electrodes, and a second region to the rear of the array, i.e. to the right in FIG. 1, in which the taps are each formed by a series connection of two pairs of overlapping adjacent electrodes.

In accordance with the invention, the transition, indicated by the line 20, between the first and second regions in the array 2 containing respective groups of taps formed by a different number of pairs of overlapping adjacent electrodes is arranged substantially to coincide with a corresponding null in the envelope of weighting factor values, namely with the null between the main lobe and the first minor lobe to the rear of the array. The transition in the array 3 is similarly located in the corresponding position.

Figure 2:
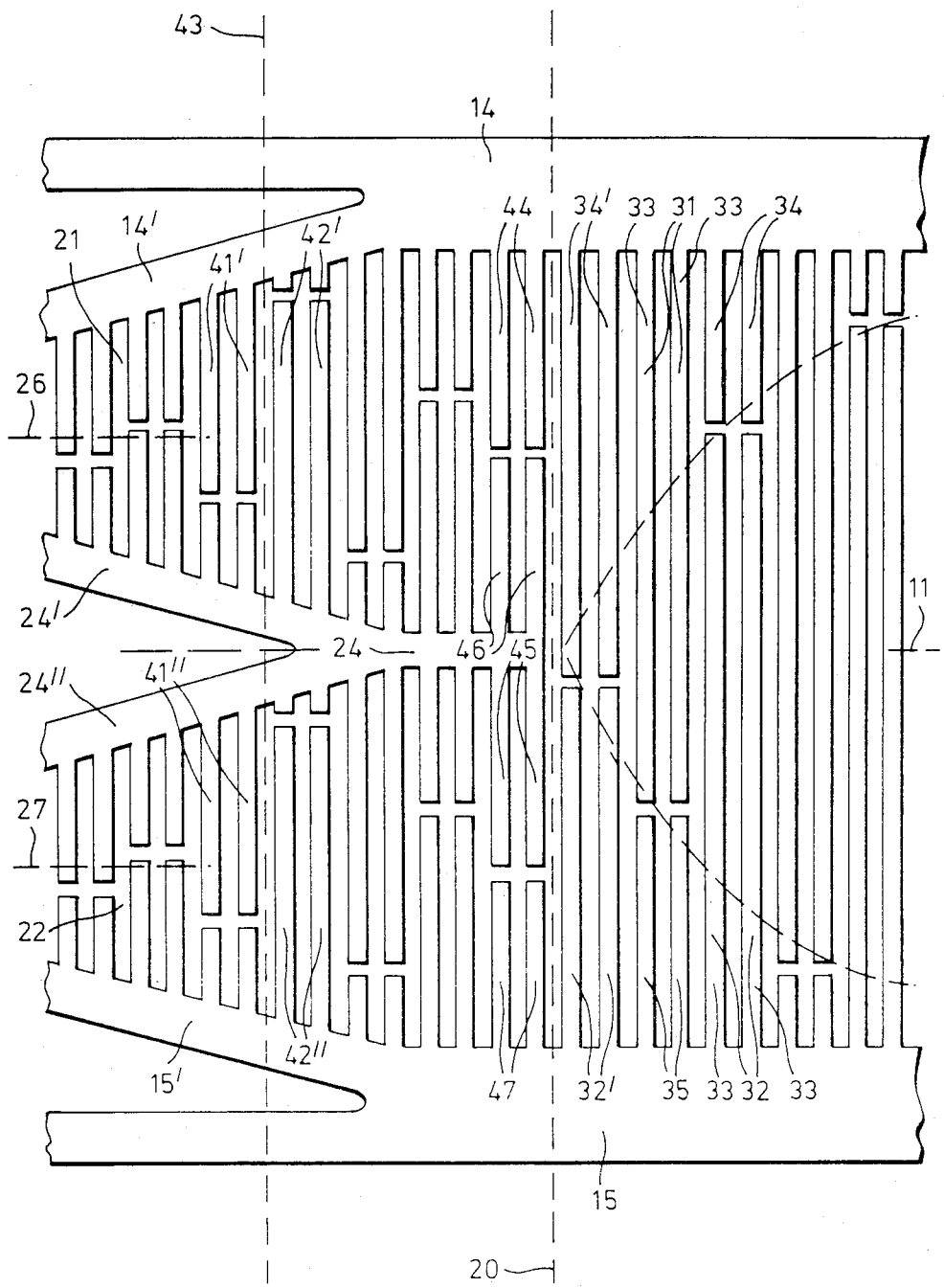
FIG. 2 is an enlarged detail of a transducer array shown in FIG. 1.

FIG. 2 shows, enlarged, a portion of the array 2 which includes the line of transition 20 to the right of which lies the first region, wherein each tap is formed by the overlapping portion of a single pair of adjacent double electrodes 31, 32, formed by parallel conducting strips 33 of which $\lambda c/8$ and center to center spacing $\lambda c/4$ connected to corresponding opposite terminal bus bars 14, 15. In conventional manner, the space between the far end of an electrode 31, 32 and the opposite bus bar 15, 14 is filled by means of a dummy electrode 35, 34, also of double construction.

The second region, to the left of the transition line 20, is formed by two interdigital electrode arrays 21 and 22, arranged side by side and connected in series from one terminal bus bar 14 to the other bus bar 15 by means of a common intermediate bus bar 24. Within this region each tap is formed by the overlapping portions of two pairs of overlapping adjacent electrodes 41', 41', and 41" and 42" connected in series via the common bus bar 24, and arranged so that each pair is disposed symmetrically about a common center line 43 directed at right angles to the propagation axis 11 of the array 2, so as to transduce the same phase of a surface acoustic wave propagating along the array axis 11.

The amount of overlap required for each pair of electrodes in such a series connection will be the same for a given tap, and will also be substantially the same as the length of overlap of a single pair of electrodes connected across the terminal bus bars 14, 15 required to provide a given weighting factor for the tap. The reason for this is that while the signal voltage across each of the two series connected pairs is only half the terminal voltage, in fact the surface acoustic wave energy is more efficiently transduced between the transducer array and the multistrip coupler by the equivalent transducing component which has a total length across the array of twice the length of overlap of the single pair of electrodes.

The transition 20 between the first and second regions of the array 2 is located in the vicinity of the first null to the left of the main lobe in FIGS. 1 and 2. At the transition 20 the left hand edges of the double electrode 32' lie adjacent the right hand edges of the double electrodes 44 and 45 and of the double dummy electrodes 46 and 47. The electrodes 34' and 44 are connected to the same bus bar 14 so that no transducing effect will be set up between the adjacent edges thereof. Similarly the electrodes 32' and 47 are both connected to the other bus bar 15 with a similar result. The electrodes 45 and 46, however, are connected to the intermediate bus bar 24, and because the two arrays 21, 22, which are connected in series between the terminal bus bars 14 and 15, are substantially identical, the bus bar 24 will be at a signal potential midway between those of the terminal bus bars 14 and 15. Thus if the bus bar 15 is grounded and a signal V is applied to or generated at the bus bar 14, a signal V/2 will be present on the bus bar 24. This means that opposite transducing effects will be present between the adjacent edges of electrodes 34' and 46, and those of electrodes 32' and 45, and the magnitude and sign of the resultant effect will depend on the difference in the lengths of overlap of the respective adjacent pairs of edges.

In the example shown in FIG. 2 the lengths of the electrodes 32' and 34' are such that the overlaps of the respective pairs of adjacent electrode edges are made the same, thus providing a zero value for the weighting factor associated with a tap located at the point of transition.

It should be noted, however, that although in accordance with the invention the transition 20 must be arranged substantially to coincide with a corresponding null in the envelope of weighting values, it is nevertheless often either desirable or necessary that a tap should be located at the transition point having a predetermined small weighting factor value, and this can be provided by making the overlaps of the respective pairs of adjacent electrode edges of suitably different lengths, bearing in mind that the difference in the length of overlap which determines the weighting factor will relate to only half of the signal voltage across the terminal bus bars.

Figure 3:
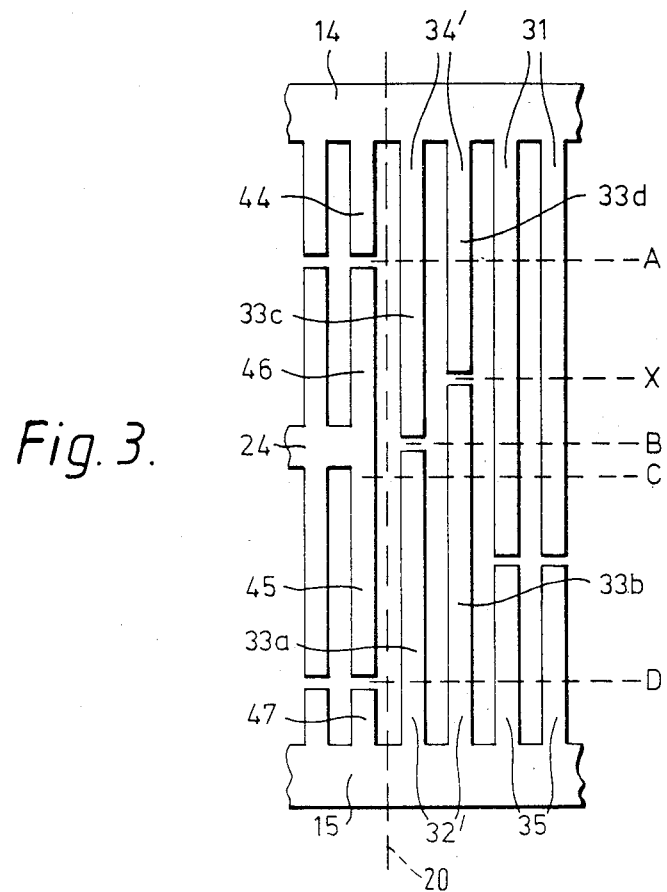
FIG. 3 is a diagram illustrating a modification of FIG. 2.

The provision of such a tap is illustrated diagrammatically in FIG. 3, which shows electrodes immediately adjacent the transition 20 in a modified form of the array 2 shown in FIGS. 1 and 2. As in FIG. 2, part of the left hand edges of the left hand conductors 33a, 33c of the double conductor 32' and the dummy double conductor 34' lie adjacent the right hand edges of the double conductor 45 and the dummy double conductor 46 connected to the common intermediate bus bar 24. Thus the conducting edge at intermediate signal potential, i.e. connected to the bus bar 24, has an overlap with the conductor 33c connected to bus bar 14 indicated by the distance AB, and has an overlap with the conductor 33a connected to the other terminal bus bar 15 indicated by the distance BD. The distance CD is marked off to be the same as the distance AB, hence the transducing effects of the overlaps AB and CD are equal and opposite leaving a net transducing effect to be produced by the overlap distance indicated by BC which determines, bearing in mind the reduced signal potential of the bus bar 24, the weighting factor of the tap located at the transition 20.

FIG. 3 also shows a further modification of the interdigital array in which the conductors 33a, b and 33c,d respectively forming the electrodes 32 and 34, are not the same length for a given electrode. This enables a quadrature tap to be introduced, displaced by $\lambda/4$ from the main sequence of taps whose weighting factor is determined by the overlap between the conductor 33c of the dummy electrode 34' and the conductor 33b of the electrode 32'. Such a tap can be employed for correction purposes and a sequence of quadrature taps can be provided along the array if required. It will be apparent that the weighting factor for the tap located between the electrode 32' and the next adjacent electrode 31 to the right will be determined principally by the overlap between the right hand conductor 33b and the electrode 31, though nearest neighbors have also to be taken into consideration in the calculation, as in the case with all the taps.

Figure 4:
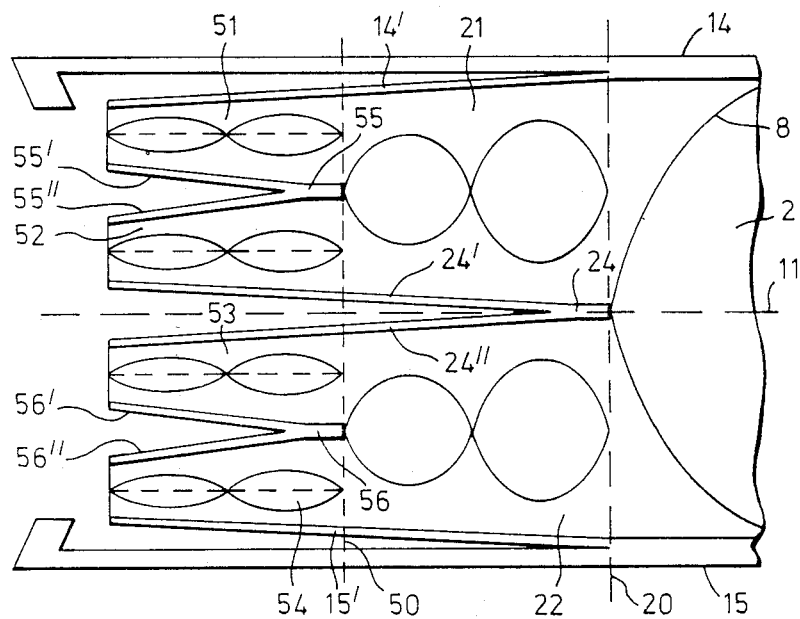
FIG. 4 shows parts of a modification to FIG. 1.

FIG. 4 illustrates a further modification of the array 2 shown in FIGS. 1 and 2 in which each of the series-connected arrays 21 and 22 forming the rearward portion of the interdigital array 2, is divided into further respective series-connected pairs of arrays 51, 52 and 53, 54 having corresponding intermediate connecting bus bars 55 and 56 each of which is divided into tapering bus bar portions 55', 55" and 56',56", as in the case of the bus bar 24 whose tapered portions 24',24" are extended rearwardly as are the outer bus bars 14' and 15'. The inwardly tapering bus bars cause rearwardly propagating acoustic surface wave energy to be reflected at an angle to the desired propagation direction and to be subsequently scattered or absorbed by absorbing medium 10, normally applied to the surface of the wafer 1 outside the active region of the arrays, the multistrip coupler and the desired propagation path.

In accordance with the invention the transition 50 between the series connection of two arrays 21, 22, and the series connection of four arrays 51, 52, 53 and 54 is located substantially at the null between the second and third minor lobes to the left of the main lobe in FIG. 4. Similar considerations apply to the electrode disposition about the transition 50 as were described above with respect to the transition 20.

Figure 5:
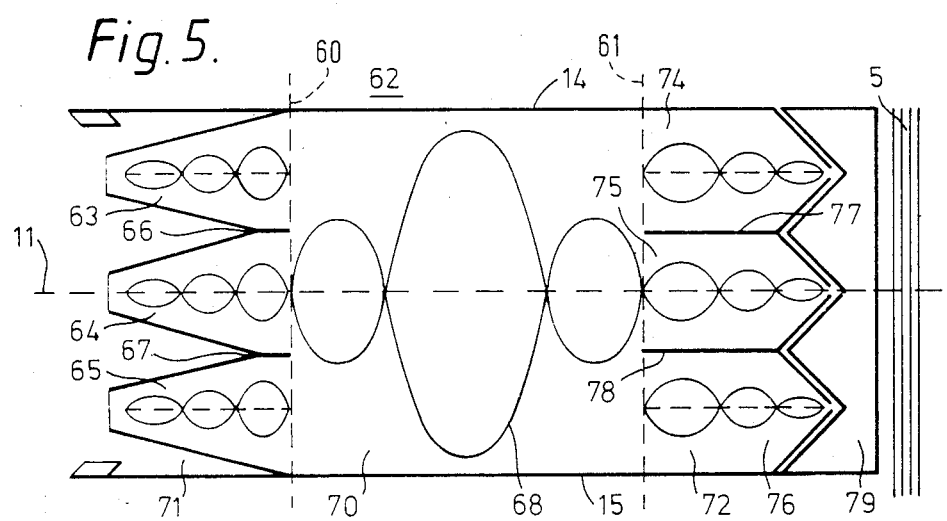
FIG. 5 shows an array forming part of a further embodiment of the invention.

A further embodiment of the invention is illustrated in FIG. 5 which depicts an interdigital transducer array 62 to be employed in the place of the arrays 2 and 3 in the device shown in FIG. 1. The array 62 includes, as indicated by the overlap envelope 68 of the pairs of adjacent electrodes connected between the terminal bus bars 14 and 15, a first central section 70 in which a main lobe is flanked on either side by a first minor lobe of the tap-weighting function. The array further includes two transitions 60, 61, between the central section, where each tap is formed by a single pair of adjacent electrodes, and corresponding rearward and forward sections 71, 72 in each of which each tap is formed by the series connection of three pairs of overlapping electrodes located on the same transverse line.

The rearward section 71 is formed by the series connection of three interdigital arrays 63, 64, 65 connected by interconnecting bus bars 66, 67. The bus bars of each array 63, 64, 65 are tapered inwards as before to reduce the adverse effects of reflected surface waves. In accordance with the invention, the transition 60 is located substantially at a null in the weighting factor distribution, between the first and second minor lobes to the left of the main lobe in FIG. 5.

In the present embodiment the forward section 72 is also subdivided into a series connection of three interdigital arrays 74, 75, 76 connected between the terminal bus bars 14, 15 via respective interconnecting bus bars 77 and 78. In the forward section, the bus bars 14, 15, 77, 78 are maintained parallel to the front part of the section 72 at which point they are tapered in parallel to a closely adjacent grounded bus bar forming a corresponding boundary to a velocity matching section 79 filled with grounded dummy conductors and having a communicating end adjacent the multistrip coupler 11 which is parallel to the conductors in the coupler, following the arrangement described in copending U.K. Patent Application No. 8211248, for the reduction of adverse transducing effects from the electrically unbalanced front edges of signal carrying conductors.

The arrangement of FIG. 5 has the advantage that the array is symmetrical. In fact the arrangement shown in FIG. 1 or in FIG. 4 can also be made symmetrical by subdividing the front portion of the array in a similar manner. It will be understoood that transitions between different numbers of electrode pairs other than one to two, two to four or one to three can also be arranged in accordance with the invention substantially at the location of a suitable null in the weighting factor distribution, and the main central lobe can be formed by taps each made up of a series connection of electrode pairs if desired.

I claim:

1. A surface acoustic wave device comprising, a piezoelectric substrate for propagating a surface acoustic wave at a surface thereof, and transducer means for launching or receiving surface acoustic wave energy propagating along a predetermined propagation direction at said surface, said transducer means comprising a length-weighted interdigital electrode array arranged to provide along a propagation path therethrough the effect of a sequence of weighted taps having weighting factors which conform to an envelope of values having a main lobe and at least one pair of minor lobes disposed respectively before and after the main lobe, wherein at least some of the taps having smaller weighting factors each comprise the overlapping portions of a plurality of similar pairs of adjacent electrodes electrically connected in series so as to transduce the same phase of a surface acoustic wavefront propagating along said propagation direction, characterized in that the transducer array is made up of a succession along its length of non-overlapping groups of taps, each group comprising taps each formed by the same respective number of said pairs of electrodes, and the transition from each group to a next adjacent group, whose taps are formed by a different number n of pairs of electrodes which are series-connected when n > 1, is arranged substantially to coincide with a corresponding null in the envelope of weighting factor values.

2. A device as claimed in claim 1, wherein the series connections between series connected said pairs of electrodes in a said group is provided via corresponding common interconnecting bus bars.

3. A device as claimed in claim 1, wherein the transducer array comprises a symmetrical arrangement of said groups about a central main lobe.

4. A device as claimed in claim 1 wherein a tap having a predetermined small weighting factor is located at a said transition.

5. A device as claimed in claim 2 wherein the transducer array comprises a symmetrical arrangement of said groups about a central main lobe.

6. A device as claimed in claim 3 wherein a tap having a predetermined small weighting factor is located at a said transition.

* * * * *